United States Patent [19]

Charbonnier

[11] Patent Number: 4,536,721
[45] Date of Patent: Aug. 20, 1985

[54] LOW NOISE CRYSTAL OSCILLATOR

[75] Inventor: Roger Charbonnier, Meudon Bellevue, France

[73] Assignee: Adret Electronique, France

[21] Appl. No.: 597,879

[22] Filed: Apr. 9, 1984

[30] Foreign Application Priority Data

Apr. 20, 1983 [FR] France .............................. 83 06782

[51] Int. Cl.³ .............................................. H03B 5/36
[52] U.S. Cl. .................................. 331/116 R; 331/74; 331/158
[58] Field of Search ............. 331/116 R, 116 FE, 158, 331/159, 160, 74

[56] References Cited

U.S. PATENT DOCUMENTS

| 3,315,179 | 4/1967 | Whitbread | 331/116 R |
| 3,358,244 | 12/1967 | Er-Chun Ho et al. | 331/116 R |
| 3,382,447 | 5/1968 | Racy | 331/116 R |

Primary Examiner—Siegfried H. Grimm
Attorney, Agent, or Firm—William A. Drucker

[57] ABSTRACT

A crystal oscillator comprises an active coupling member driving the series mode resonance of a piezoelectric crystal proportionally to a feedback voltage. Said coupling member is followed by a current boosting transformer whose secondary winding is connected to an output amplifier and to a clipping amplifier shunted across said secondary winding and itself followed by a band-pass filter which supplies said feedback voltage to said coupling member.

4 Claims, 2 Drawing Figures

LOW NOISE CRYSTAL OSCILLATOR

BACKGROUND OF THE INVENTION

The invention relates to crystal oscillators.

It relates more particularly to a crystal oscillator intended for use as a frequency standard in fields such as telecommunications and electronic instrumentation and having a very good short term stability of its oscillation frequency (i.e. having a high spectral purity), without its long term stability being impaired for all that.

The oscillator of the invention is, to this end, adapted so that the spurious noise introduced by the electronic components which is comprises is as reduced as possible; without the power dissipated in the crystal having to be increased for all that, at least beyond a chosen value and which remains compatible with the provision of good long term stability.

SUMMARY OF THE INVENTION

According to the invention, this result is obtained by means of a circuit comprising an active coupling member driving the series mode resonance of a piezoelectric crystal proportionally to a feedback voltage, wherein said coupling member is followed by a current booster transformer whose secondary winding is connected to an output amplifier and to a clipper-amplifer shunted across the secondary winding and itself followed by a band-pass filter which supplies said feedback voltage to the coupling member.

BRIEF DESCRIPTION OF THE DRAWINGS

Other features as well as the advantages of the invention will be clear from the following description.

In the accompanying drawings.

DESCRIPTION OF THE PREFERRED EMBODIMENT

Figure 1:
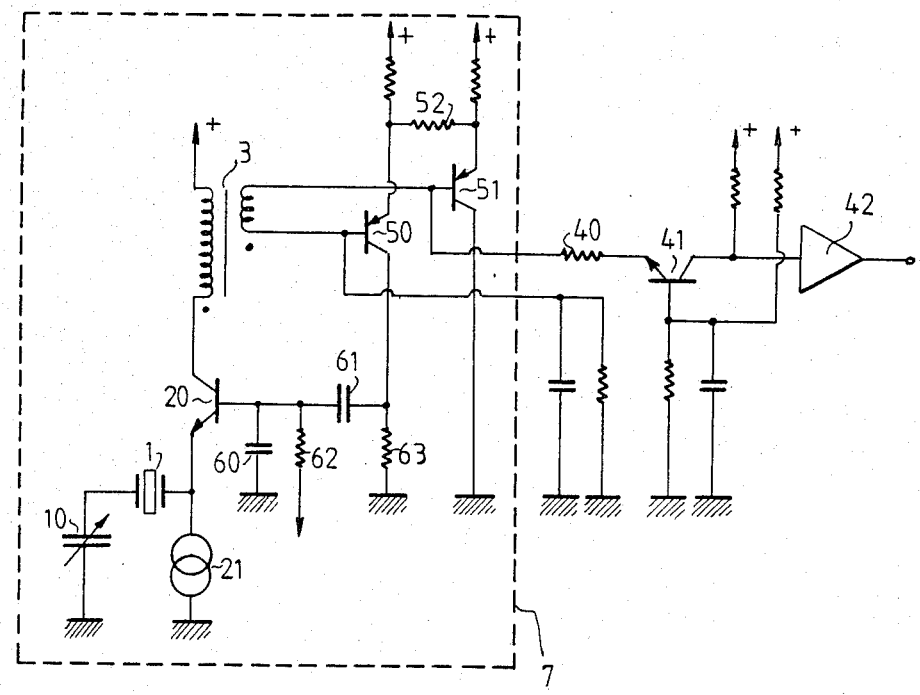
FIG. 1 is the diagram of an oscillator according to a preferred embodiment.

In FIG. 1 is shown a piezoelectric quartz crystal 1 used in the series resonance mode and associated with a frequency adjustment member 10. This latter, shown symbolically by a capacitor, is in actual fact formed from one or more fixed and adjustable capacitors and/or from one or more variable capacity diodes allowing electric adjustment of the oscillation frequency.

An active coupling member 2 is essentially formed by a bipolar transistor 20, in which the AC component of the emitter voltage follows the AC voltage of the base.

The oscillating current of the crystal passes through the emitter-collector space for supplying the primary winding of a transformer 3. A DC source 21, formed for example by a resistor of a high value with respect to the dynamic resistance of the crystal, supplies the means biasing current of transistor 20.

The secondary winding of transformer 3 is loaded by a resistor 40 and a bipolar transistor 41, connected in a "common base" configuration. The AC component of the collector current of transistor 41 is directed to the point of use through an output amplifier 42 as required. Assembly 4 (elements 41–42) forms a low noise output amplifier having a predetermined input resistance, which delivers the useful output signal of the circuit.

A symmetrical clipping amplifier 5 is shunted across the secondary winding of the transformer. It delivers at its output a trapezoidal shaped wave having a regulated peak to peak value. This amplifier is advantageously a differential amplifier and formed by a pair of transistors 50–51. Resistor 52 which connects the emitters together is dimensioned so as to cause alternately cut off of these transistors, then to provide chopping of the current from the collector of 50.

A band-pass connecting filter 6, with low Q-factor and centered on the oscillation frequency of the crystal, delivers to the coupling member 2 the AC voltage required for sustaining the oscillation. It may be formed, as shown in FIG. 1, by a simple Wien network formed from capacitors 60–61 and resistors 62–63.

The currents for biasing the different active members of the circuit which has just been described are determined by suitable networks, known per se. The different voltages required are regulated, also in a way known per se, with respect to the variations of the primary energy source.

The oscillator assembly properly speaking 1-2-3-5-6 is advantageously housed in a thermal-regulated enclosure 7 providing a constant temperature chosen preferably close to the temperature at which the frequency/temperature coefficient of the crystal is cancelled out.

Figure 2:
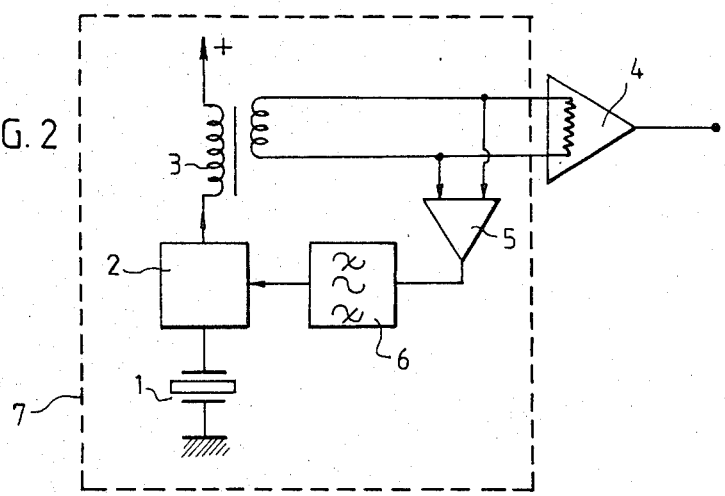
FIG. 2 is a simplified diagram for a better understanding of the operation.

The operation of the circuit which has just been described will be better understood with reference to the simplified diagram of FIG. 2.

The active coupling member 2 excites the series mode resonance of the crystal, by applying thereto a feedback voltage taken from the secondary winding of transformer 3, amplified by the amplitude-limiting or clipping amplifier 5 and filtered by the band-pass filter 6.

The AC voltage thus imposed by the coupling member 2 on the terminals of the crystal is equal to or a little less than that from filter 6. Member 2 transmits to the primary winding of the transformer an oscillating current substantially equal to the one flowing through the crystal. The transformer plays the role of a voltage divider and, correlatively, of a current booster. The AC current which flows through transistor 41 is thus considerably greater than the current of the crystal (in practice, two to four times). The result is that the contribution of transistor 41 to the noise generated by the circuit is minimized. Furthermore, since it is the current of the crystal which is directly transmitted to the output circuit (amplifier 42) through transistor 20, transformer 3 which boosts it and transistor 41, no additional noise source is introduced by the clipping or filtering members.

The clipping circuit 5 for sustaining the oscillation is in effect shunt connected so that its own noise is not amplified outside the pass-band of the crystal. It should be noted that the gain of transistor 20 is very much less than unity outside this band, because of the high dynamic impedance of source 21 or because of the high value resistance which takes its place.

Finally, this circuit provides a high spectral purity, whence a short term stability of the frequency of the circuit close to that of the crystal itself. This stability is obtained without for all that dissipating an excessive power, which would adversely affect the long term stability. The oscillation power level of the circuit is, in fact, perfectly mastered, for the active coupling member 2 imposes on the terminals of the crystal an AC voltage which follows that of the base of the transistor 20, i.e. is equal to or slightly less than that from filter 6, itself fed with the regulated signal coming from amplifier 5.

With a judicious choice of the components, the performance can be optimized. In particular:

the current gain with common emitter configuration of transistor 20 will be advantageously high, so as to minimize the so called "distribution" noise;

the impedance at the secondary of transformer 3 will be preferably high with respect to resistor 40, so as to make the voltage noise of this latter ineffective;

the impedance of filter 6 will be advantageously as small as possible;

the crystal will advantageously have a high proper Q-factor and a series resistance at resonance greater than the inverse of the input admittance, in a "common base" configuration, of transistor 20, so as not to reduce the Q-factor of the crystal under load.

By way of example, an oscillator in accordance with the invention, by imposing on the crystal a power of 25 microwatts, delivers an output signal whose spurious phase noise is typically -164 dBc at 1 KHz of the principal frequency, which here is 10 MHz.

It will of course be readily understood that different modifications may be made to the circuit described and shown without departing from the spirit of the invention.

In particular, the bipolar transistors 20, 41, and 50-51 could be of a polarity opposite the one shown, or could even be replaced by field effect transistors. Filter 6 could be formed by a more selective network than the Wien network, in particular in the case where the crystal has parasitic oscillation modes, at frequencies close to the rated operating frequency, or in the case where the oscillation takes place in a partial mode of high order.

What is claimed is:

1. An oscillator comprising:
   a crystal resonator;
   active coupling circuit means having first and second inputs and an output, the first input being connected to the crystal resonator;
   a current booster transformer having primary and secondary windings, the primary winding being connected to the output of the coupling circuit means;
   output amplifier means connected in series with the secondary winding;
   amplitude limiting amplifier means connected in parallel across the secondary winding said amplitude limiting amplifier means having an output; and
   band-pass filter means connecting the output of said amplitude limiting amplifier means to the said second input.

2. An oscillator as claimed in claim 1, wherein the coupling circuit means include a transistor.

3. An oscillator as claimed in claim 2, wherein the amplitude limiting amplifier means include two transistors arranged in a differential circuit and alternately conductive.

4. An oscillator as claimed in claim 3, wherein the band-pass filter means comprises a Wien network.

* * * * *